US011120864B2

(12) United States Patent
Joshi et al.

(10) Patent No.: US 11,120,864 B2
(45) Date of Patent: Sep. 14, 2021

(54) CAPACITIVE PROCESSING UNIT

(71) Applicant: International Business Machines Corporation, Armonk, NY (US)

(72) Inventors: Rajiv Joshi, Yorktown Heights, NY (US); Sudipto Chakraborty, Plano, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/707,838

(22) Filed: Dec. 9, 2019

(65) Prior Publication Data
US 2021/0174858 A1 Jun. 10, 2021

(51) Int. Cl.
*G11C 11/409* (2006.01)
*G06N 3/04* (2006.01)
*G11C 11/403* (2006.01)
*G06N 3/063* (2006.01)
*G11C 11/402* (2006.01)
*G06N 3/10* (2006.01)

(52) U.S. Cl.
CPC ............. *G11C 11/409* (2013.01); *G06N 3/04* (2013.01); *G06N 3/063* (2013.01); *G06N 3/10* (2013.01); *G11C 11/403* (2013.01); *G11C 11/4023* (2013.01)

(58) Field of Classification Search
CPC . G11C 11/409; G11C 11/403; G11C 11/4023; G06N 3/04; G06N 3/063; G06N 3/10
USPC ...................................................... 365/181
See application file for complete search history.

(56) References Cited

U.S. PATENT DOCUMENTS 6,992,927 B1 1/2006 Poplevine et al.
10,559,350 B2 * 2/2020 Oda ...................... G11C 11/418
(Continued)

FOREIGN PATENT DOCUMENTS

CN 101373634 A 2/2009
CN 108073984 A 5/2018
(Continued)

OTHER PUBLICATIONS

Allen, Holberg, "CMOS Analog Circuit Design," Holt, Rinehart and Winston, Inc., pp. 231-233 (Year: 1987).*
(Continued)

*Primary Examiner* — Fernando Hidalgo
(74) *Attorney, Agent, or Firm* — Scully, Scott, Murphy & Presser, P.C.; Daniel P. Morris

(57) ABSTRACT

A structure of a memory device is described. The structure can include an array of memory cells. A memory cell can include at least one metal-oxide-semiconductor (MOS) element, where a source terminal of the at least one MOS element is connected to a drain terminal of the MOS element. The source terminal being connected to the drain terminal can cause the at least one MOS element to exhibit capacitive behavior for storing electrical energy. A first transistor can be connected to the at least one MOS element, where an activation of the first transistor can facilitate a write operation to the memory cell. A second transistor can be connected to the at least one MOS element, where an activation of the second transistor can facilitate a read operation from the memory cell.

18 Claims, 8 Drawing Sheets

(56) References Cited

U.S. PATENT DOCUMENTS

| | | | |
|---|---|---|---|
| 2006/0001634 A1* | 1/2006 | Lee | G09G 3/3648 345/98 |
| 2008/0310237 A1 | 12/2008 | Zhou et al. | |
| 2017/0329433 A1 | 11/2017 | Abzarian et al. | |
| 2018/0336139 A1 | 11/2018 | Rao et al. | |
| 2020/0320366 A1* | 10/2020 | Wang | G06N 3/08 |

FOREIGN PATENT DOCUMENTS

| | | | | |
|---|---|---|---|---|
| CN | 110245749 A | 9/2019 | | |
| WO | WO-02059970 A2 * | 8/2002 | ......... | H01L 27/0288 |
| WO | 2018089483 A1 | 5/2018 | | |

OTHER PUBLICATIONS

Lo, S.-H., et al., "Modeling and characterization of quantization, polysilicon depletion, and direct tunneling effects in MOSFETs with ultrathin oxides", IBM J. Res. Develop. May 1999, pp. 327-337, vol. 43, No. 3.

International Search Report dated Feb. 25, 2021 issued in PCT/IB2020/060964, 9 pages.

\* cited by examiner

| | WEIGHT_0 | WEIGHT_1 | WWL_0 | WWL_1 | RWL_0 | RWL_1 | CELL_0 | CELL_1 | Result | Comment |
|---|---|---|---|---|---|---|---|---|---|---|
| T1 | 0 | 0 | 1 | 0 | 1 | 0 | 0 | | | Write |
| T2 | 0 | 0 | 0 | 1 | 0 | 1 | | 0 | | Write |
| T3 | | | 0 | 0 | 1 | 1 | | | 0<br>0.38mv | Read |
| T4 | 0 | 0 | 1 | 0 | 1 | 0 | 0 | | | Write |
| T5 | 0 | 1 | 0 | 1 | 0 | 1 | | 1 | | Write |
| T6 | | | 0 | 0 | 1 | 1 | | | 1<br>0.550mV | Read |
| T7 | | 0 | 1 | 0 | 1 | 0 | 1 | | | Write |
| T8 | 1 | 1 | 0 | 1 | 0 | 1 | | 1 | | Write |
| T9 | 1 | | | | 1 | 1 | | | 1⁺<br>0.799mV | Read |

CAPACITIVE PROCESSING UNIT

BACKGROUND

The present disclosure relates in general to memory devices in neuromorphic hardware and systems that can be used for implementing artificial neural networks.

An artificial neural network (ANN) is a computational model inspired by biological neural networks in human or animal brains. An ANN progressively and autonomously learns tasks by means of examples. Applications of ANN may include, but are not limited to, speech recognition, text processing and image classification. An ANN comprises a set of connected nodes (or neurons) and edges (connections between the nodes). Signals can be transmitted along the edges between the nodes. A node that receives a signal may process the received signal and convey the processed signal (an output) to connected nodes. Weights can be associated with the connections and nodes, and the weights can be adjusted as the learning proceeds.

SUMMARY

In some examples, a structure of a memory device is generally described. The structure can include an array of memory cells. A memory cell can include at least one metal-oxide-semiconductor (MOS) element, where a source terminal of the at least one MOS element is connected to a drain terminal of the MOS element. The source terminal being connected to the drain terminal can cause the at least one MOS element to exhibit capacitive behavior for storing electrical energy. A first transistor can be connected to the at least one MOS element, where an activation of the first transistor can facilitate a write operation to the memory cell. A second transistor can be connected to the at least one MOS element, where an activation of the second transistor can facilitate a read operation from the memory cell.

In some examples, a system including a memory, a processor, and a structure, is generally described. The processor can be configured to be in communication with the memory. The structure can be configured to be in communication with the memory and the processor. The structure can include an array of memory cells. A memory cell can include at least one metal-oxide-semiconductor (MOS) element, where a source terminal of the at least one MOS element is connected to a drain terminal of the MOS element. The source terminal being connected to the drain terminal can cause the at least one MOS element to exhibit capacitive behavior for storing electrical energy. A first transistor can be connected to the at least one MOS element, where an activation of the first transistor can facilitate a write operation to the memory cell. A second transistor connected to the at least one MOS element, where an activation of the second transistor facilitates a read operation from the memory cell. The processor can be configured to generate one or more control signals to control the write and read operations of the array of memory cells.

In some examples, a memory device is generally described. The memory device can include a non-volatile memory configured to store data, and a structure coupled to the non-volatile memory. The structure can include an array of memory cells. A memory cell can include at least one metal-oxide-semiconductor (MOS) element, where a source terminal of the at least one MOS element is connected to a drain terminal of the MOS element. The source terminal being connected to the drain terminal can cause the at least one MOS element to exhibit capacitive behavior for storing electrical energy. A first transistor connected to the at least one MOS element, where an activation of the first transistor facilitates a write operation to the memory cell. A second transistor connected to the at least one MOS element, where an activation of the second transistor facilitates a read operation from the memory cell. The write operation can change the capacitance of the plurality at least one of MOS element, and the changed capacitance can update the data stored in the non-volatile memory.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 6 is a table showing an example implementation of a capacitive processing unit in one embodiment.

DETAILED DESCRIPTION

Figure 1:
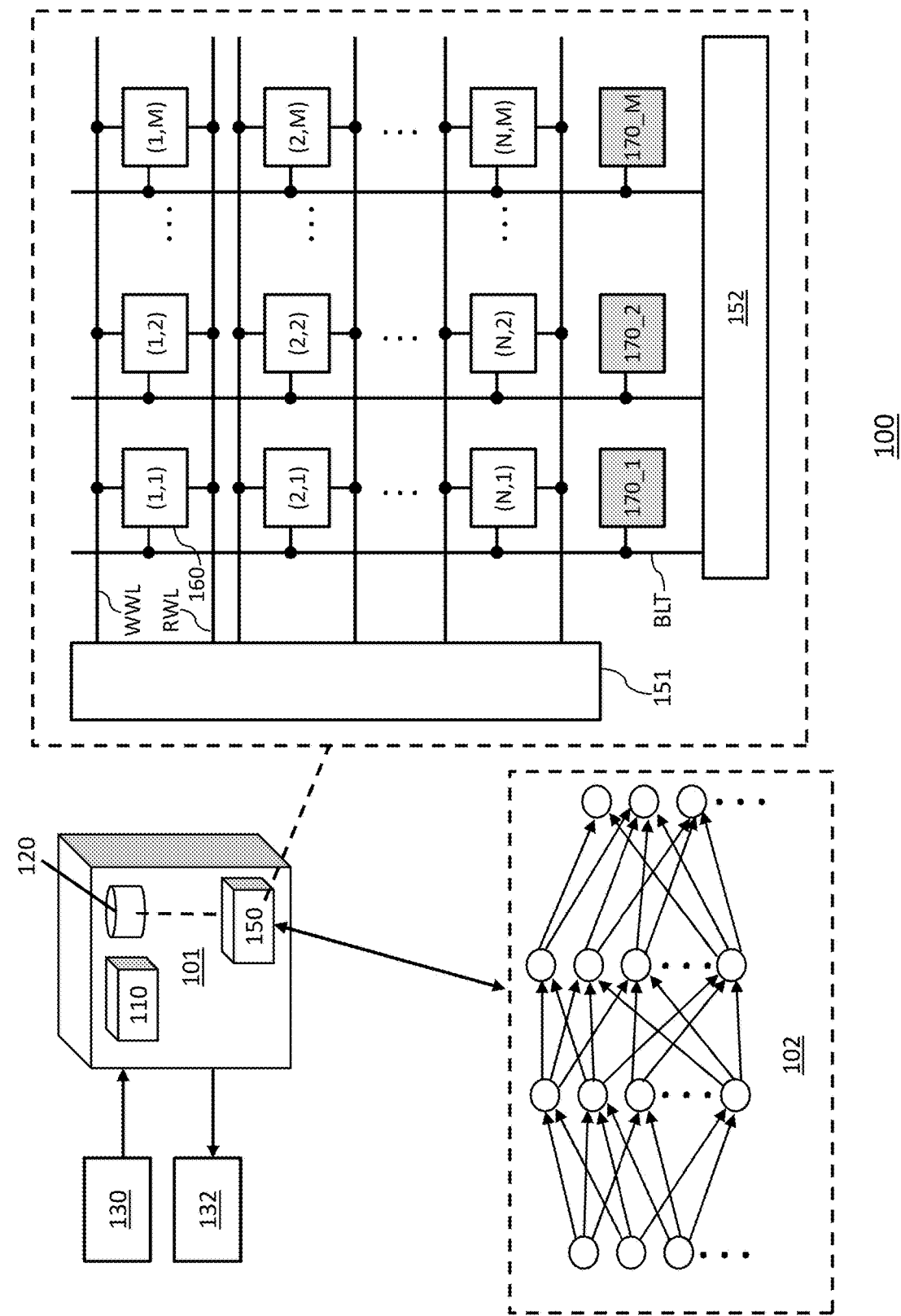
FIG. 1 is a diagram showing an example system that includes one or more capacitive processing units in one embodiment.

The following descriptions of example embodiments of various types of neural networks are presented by way of example. It is noted that embodiment(s) of a neural network described in the present disclosure is not limited to the examples described herein.

A deep neural network (DNN) is an ANN with multiple layers between the input and output layers. A DNN may learn relationships between input data and output data and may use the learned relationships to transform future inputs into outputs. The DNN moves through the layers calculating the probability of each output, and each functional manipulation is considered as a layer. In an example where DNN is applied on image recognition, an example goal of a DNN is to learn features of an image and classify new input images by comparing them with the learned features, without requiring human input. DNNs may also be used to model relatively complex non-linear relationships, and are typically feedforward networks.

In a feedforward neural network (such as a multilayer perceptron), multiple nodes can be arranged in layers. Nodes from adjacent layers have connections between them, which are associated with weights. A feedforward neural network may include three types of nodes: input nodes, hidden nodes, and output nodes, arranged in respective layers. Input nodes are nodes of the input layer, and are tasked with providing information from the outside to the network. Input nodes, in some examples, pass on information to the hidden nodes of the hidden layers and may not be configured to perform computations. Hidden nodes are arranged in one or more hidden layers, and are hidden from the outside of the network. Hidden nodes are configured to perform computations and transfer information from the input layer to the output nodes. Output nodes of the output layer may compute and transfer information from the network to the outside. In an example, information propagates in one direction (forward direction) in a feedforward network, where the forward direction is from the input nodes to the output nodes, through the hidden nodes. Feedforward networks can be free of cycles or loops, which is different from recurrent neural networks (RNNs) that involve cyclic connections between nodes. A recurrent neural networks (RNNs) is a network where data can flow in any direction. RNNs can be used for applications such as language modeling.

A convolutional neural network (CNN) is a class of deep neural networks. CNNs use a variation of multilayer perceptrons, for example, designed to require minimal preprocessing. CNNs are also known as shift invariant or space invariant artificial neural networks (SIANN), based on their shared-weights architecture and translation invariance characteristics. In an example, CNNs may learn filters in various applications, such as image processing applications, where the learning is independent from prior knowledge and human input. Applications of CNNs may include, but not limited to, image and video recognition, computer vision, recommender systems, image classification, medical image analysis, acoustic modeling for automatic speech recognition (ASR), and natural language processing.

FIG. 1 is a diagram showing an example system that includes one or more capacitive processing units in one embodiment. In an example shown in FIG. 1, a system 100 can include a device 101 configured to implement a neural network, such as a DNN 102. The device 101 can be a computer device configured to receive an input 130, where the input 130 can include input data, such as, but not limited to, image data including pixel values. The device 101 can implement a neural network (e.g., DNN 102) to generate an output 132, where the output 132 can be, for example, a classification of the input 130. The device 102 can include a processor 110, a memory device (or memory) 120 configured to be in communication with the processor 110, and a structure 150 configured to be in communication with the processor 110 and the memory 120. In one example embodiment, the structure 150 and the memory 120 can be integrated in the same memory device. In another example embodiment, the structure 150 can be a memory accelerator.

In an example, the processor 110 can receive the input 130 and transmit the input 130 to the structure 150. The structure 150 can include a plurality of capacitive processing units or devices 160 ("cells 160"). In the example shown in FIG. 1, the structure 150 can include N×M capacitive processing units 160 (N rows from row i=1, ..., N; and M columns from column j=1, ..., M). A number of capacitive processing units 160 among the structure 150 can be activated based on a desired implementation of the DNN 102, attributes of the DNN 102 (e.g., size, number of layers), attributes of the input 130 and output 132 (e.g., size), and/or other factors. For example, the structure 150 can include X memory cells, and N×M cells can be activated to train the DNN 102. The structure 150 can further include a plurality of conductive wires connecting the capacitive processing units 160. For example, the structure 150 can include N write word line (WWL) wires, N read word line (RWL) wires, and M bit line true (BLT) wires. The processor 110 can be configured to generate control signals to control operations of the structure 150. For example, the processor 110 can write a logic '1' signal to all RWL wires to implement a read out operation, such that electrical energy that may be stored in the capacitive processing units 160 can be accumulated and the accumulated electrical energy can be read out as digital values.

The structure 150 can further include a circuit 151, a circuit 152, and a plurality of circuits 170. The circuit 151 and circuit 152 can be configured to receive control signals from the processor 110 and facilitate writing of the control signals to the WWL and RWL wires. The circuit 151 can include a decoder (row decoder) configured to facilitate selection or activation of one or more rows (row 1 to N) of cells 160. The circuit 152 can include a decoder (column decoder) configured to facilitate selection or activation of one or more columns (row 1 to M) of cells 160. For example, the processor 110 can send a control signal to the circuit 151 with logic '1' at bit positions 1 and 2 corresponding to WWL wires at rows i=1 and i=2, and a control signal to the circuit 152 with logic '1' at bit position 2 corresponding to BLT wire at column j=2, to facilitate write operations on cells (1,2) and (2,2). In some examples, the circuit 151 can include additional circuits such digital-to-analog converters (DACs) that can be used to convert digital inputs into analog signals (or current) that can be inputted into the cells 160. In some examples, the circuit 152 can include additional circuits such as sense amplifiers that can be used to facilitate read out of data accumulated from the electrical energy stored in the cells 160. The control signals generated by the processor 110 can be used to control the structure 150 to perform operations such as matrix operations (e.g., addition, multiplication) and vector-matrix operations (e.g., multiply-accumulate, etc.), to train and implement the DNN 102. These operations performed by the structure 150 can facilitate training of the DNN 102 including updating weights of the DNN 102 and implementing the DNN 102 to classify input data received by the device 101. The plurality of circuits 170 can be analog circuits and can be configured to store electrical energy outputted and accumulated from the cells 160. In an example embodiment, each column of cells 160 is connected to one circuit 170. In the example shown in FIG. 1, there are M circuits 170 corresponding to M columns of cells 160.

The cells 160 described in an embodiment accordance with the present disclosure includes both processing and storage capabilities. A cell 160 can include one or more metal-oxide-semiconductor (MOS) elements, where the one or more MOS elements can be configured as one or more capacitive elements operable to store electrical energy. Further, one or more clock signals can be used to switch the one or more MOS elements in at different timings to configure the capacitive processing device to perform computations. Therefore, the cell 160 can provide in-memory calculations in implementations of neural networks. The in-memory calculations can increase efficiency in an implementation of neural networks by, for example, lowering latency since the weights can be obtained from the electrical energy stored in the capacitive elements capacitive processing devices and the capacitive processing devices can also be being used to perform computations locally (in-memory calculation).

Figure 2:
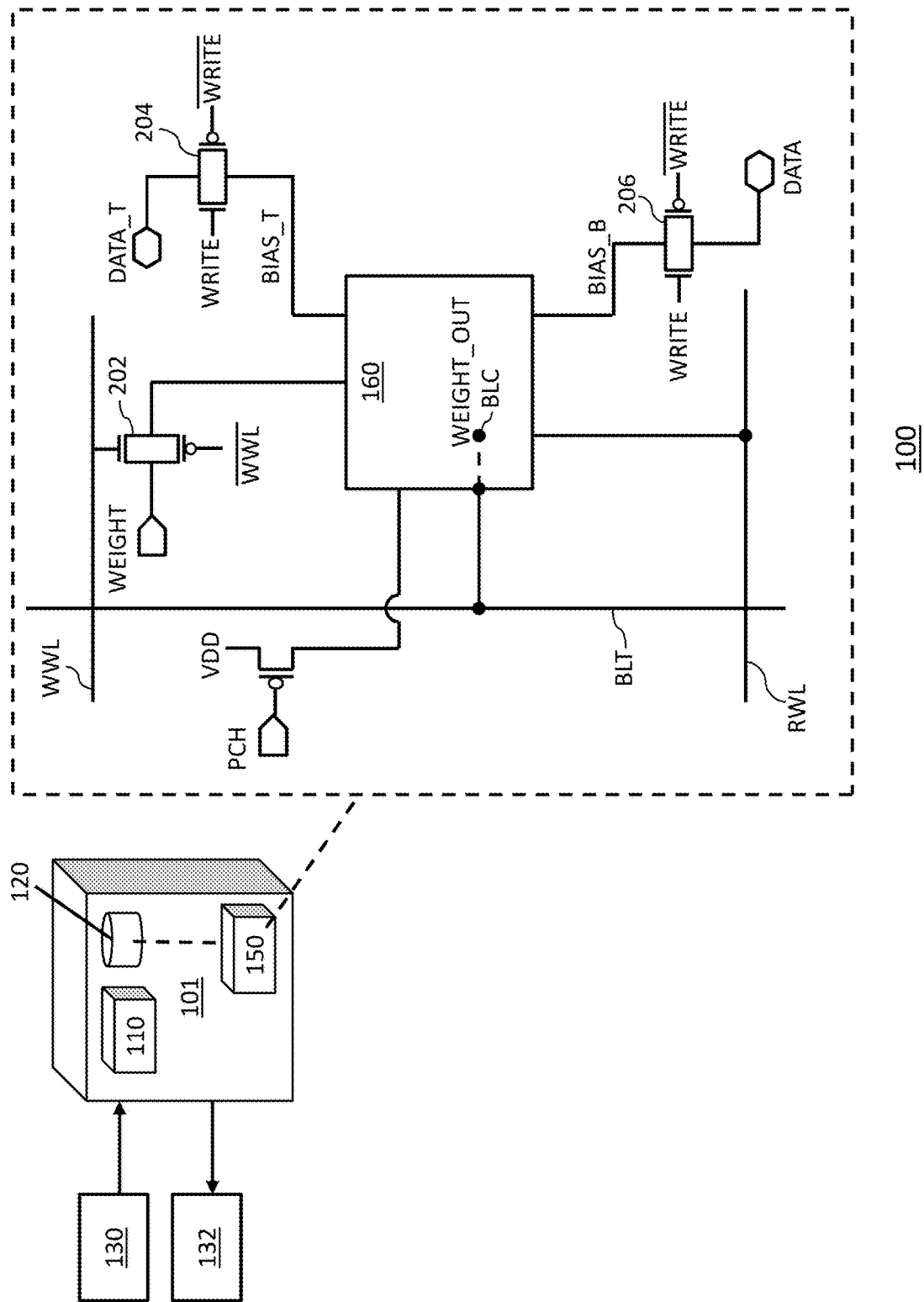
FIG. 2 is a diagram showing additional details of a structure that includes a capacitive processing unit in one embodiment.

FIG. 2 is a diagram showing additional details of a structure that includes a capacitive processing unit in one embodiment. FIG. 2 may include components that are labeled identically to components of FIG. 1, which are not described again for the purposes of clarity. The description of FIG. 2 may reference at least some of the components of FIG. 1.

In an example shown in FIG. 2, the structure 150 can include additional components and wires to facilitate different operations of the cells 160. Focusing on one cell 160, the cell 160 can be connected to a plurality of components, such as pass gates or transmission gates, that can be controlled using different signals provided by the processor 110 to cause the cell 160 to perform different operations. A plurality of control signals that can be received by the structure 150, such as 1) WRITE, 2) WEIGHT, 3) write word line (WWL) signal, 4) read word line (RWL) signal, 5) precharge (PCH) signal, 6) bias voltage denoted as DATA, and 7) bias voltage denoted as DATA_T. Note that additional input signals may be received by the structure 150. The PCH signal can be one bit, and can be a precharge signal to initialize an output line, such as the BLT wire. The WRITE signal can be one bit, and if WRITE='1', DATA_T can be passed to the cell 160 via pass gate 204, as a signal BIAS_T to bias a first set of MOS elements inside the cell 160. Similarly, if WRITE='1', DATA can be passed to the cell 160 via pass gate 206, as a signal BIAS_B to bias a second set of MOS elements inside the cell 160. DATA and DATA_T can each be M bits long, corresponding to the number of columns of cells 160 in the structure 150. The WWL and RWL signals can be N bits long, corresponding to the number of rows of cells 160 in the structure 150. WWL and RWL signals can be generated by a local clock generator that can be a part of the structure 150 or the device 101.

The WEIGHT signal can be N bits long, and can be a weight value that is being written or updated in the memory 120. If WWL signal is a logic '1', a pass gate 202 can allow the WEIGHT signal to be transmitted to the cell 160. In an example embodiment, The weights of the DNN 102 can be stored in the cells 160 and can be read out by accumulating the electrical energy stored in the cells 160. The weights of the DNN 102 can be updated by the WEIGHT signal, such as by charging or discharging capacitive elements in cells 160 that are selected by a write operation. Therefore, update to the weights can be performed locally in the cells 160. The updated amount of electrical energy among the cells 160 can be outputted via a WEIGHT_OUT pin that can be connected to an internal node labeled as bit-line complimentary (BLC). The internal node BLC can be connected to the BLT wire, and a voltage difference between the BLT wire and the internal BLC node can represent an amount of electrical energy being stored in a cell 160. The updated amount of electrical energy can be accumulated by the circuits 170 and 152 and outputted as digital values to the memory 120.

Figure 3:
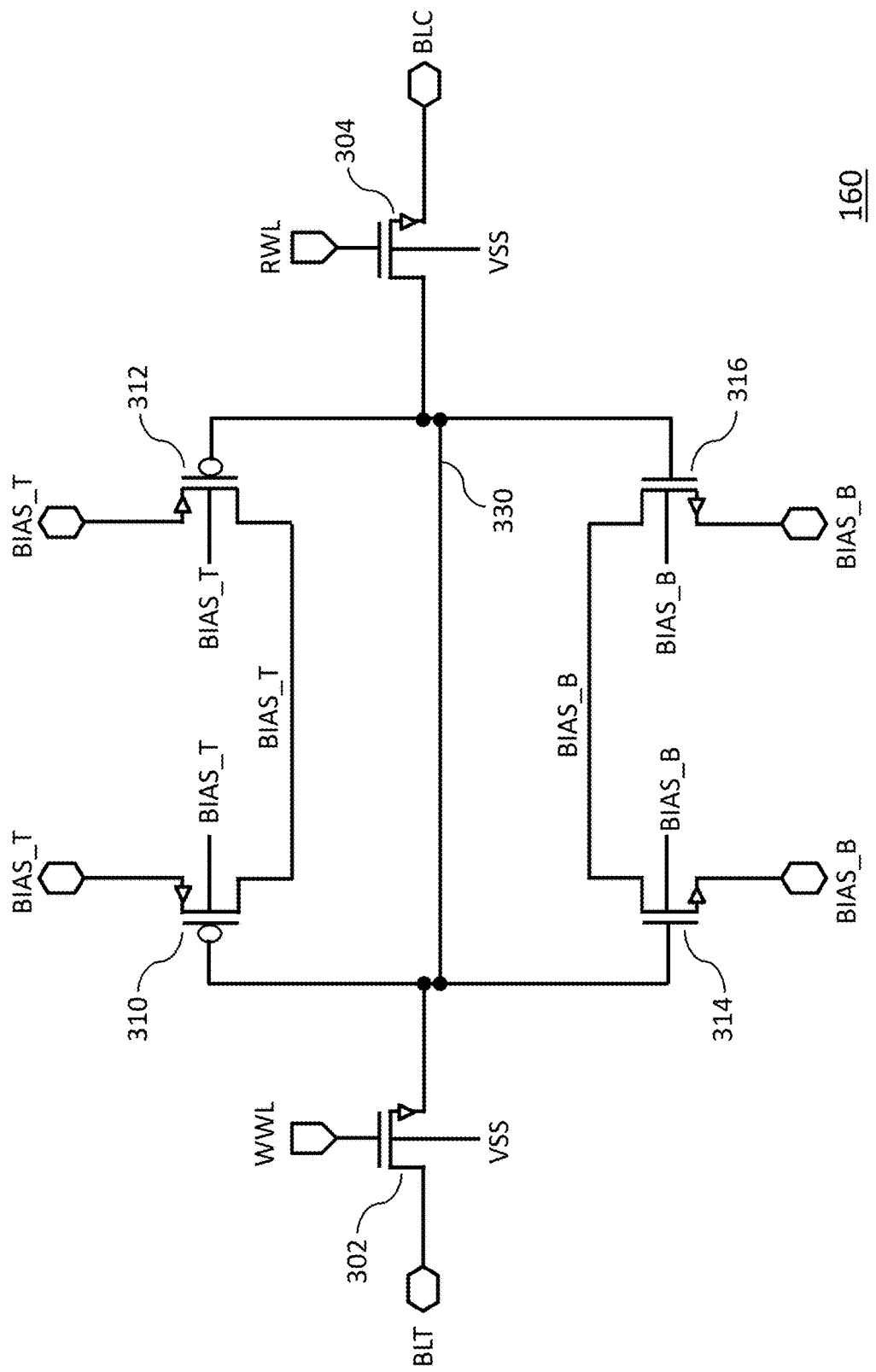
FIG. 3 is a diagram showing details of a capacitive processing unit in one embodiment.

FIG. 3 is a diagram showing details of a capacitive processing unit in one embodiment. Such configuration may include a row-column arrangement of circuit components. FIG. 3 may include components that are labeled identically to components of FIGS. 1-2, which will not be described again for the purposes of clarity. The description of FIG. 3 may reference at least some of the components of FIGS. 1-2.

The cell 160 can include a plurality of MOS elements, such as N-type MOS (NMOS) and P-type MOS (PMOS) transistors. In an example shown in FIG. 3, a NMOS transistor 302 can be controlled by signal received from the WWL wire. Another NMOS transistor 304 can be controlled by signal received from the RWL wire. Note that if the signal received from the WWL is a logic '1', current can flow from the BLT wire into the cell 160, facilitating a write operation.

Similarly, if the signal received from the RWL is a logic '1', current can flow from the cell 160 towards the BLC wire, facilitating a read operation.

The cell 160 can further include a PMOS transistor 310 and a PMOS transistor 312. The source terminal of the PMOS transistor 310 can be connected to the drain terminal of the PMOS transistor 310, or to the same voltage source. Similarly, the source terminal of the PMOS transistor 312 can be connected to the drain terminal of the PMOS transistor 312, or to the same voltage source. In the example shown in FIG. 3, the source terminals of the PMOS transistors 310 and 312 are connected to their own drain terminal, their own gate, and the same voltage source. The PMOS transistors 310 and 312 can be biased by the BIAS_T signal that was passed by the pass gate 204 in response to the WRITE signal being a logic '1'. The BIAS_T signal can be the DATA_T signal.

The cell 160 can further include an NMOS transistor 314 and an NMOS transistor 316. The source terminal of the NMOS transistor 314 can be connected to the drain terminal of the NMOS transistor 314, or to the same voltage source. Similarly, the source terminal of the NMOS transistor 316 can be connected to the drain terminal of the NMOS transistor 316, or to the same voltage source. In the example shown in FIG. 3, the source terminals of the NMOS transistors 314 and 316 are connected to their own drain terminal, their own gate, and to the same voltage source. The NMOS transistors 314 and 316 can be biased by the BIAS_B signal that was passed by the pass gate 206 in response to the WRITE signal being a logic '1'. The BIAS_B signal can be the DATA signal.

When the source terminal and drain terminal of a MOS are connected to each other, the MOS can exhibit different levels of capacitance in response to different voltages being applied on the gate of the MOS (gate voltage). Therefore, the MOS can behave similarly to a capacitor, which can be referred to as a MOS capacitor. When comparing capacitance with gate voltage, the MOS capacitor's capacitance change can be linear between gate voltage regions 0 to 1 volt (V), or from 0 to −1V. The capacitance of a MOS capacitor changes linearly with respect to gate voltages in these regions. The linearity of such capacitance-voltage characteristics of a MOS capacitor can be exploited and used as capacitive elements in a memory cell. By using MOS capacitors as capacitive elements in a memory cell, the memory cell can be controlled to store electrical energy and to perform in-memory processing using various control signals to control the MOS elements.

In an example embodiment, a voltage difference 330 between the BLT wire and the BLC wire can represent an amount of electrical energy being stored in the cell 160. A column of cells 160 can output their respective voltage difference 330 on their respective output wires, BLT or BLC. The outputted voltage difference from cells in the same column can be accumulated to generate an output of the column. Using the example where the structure 150 has N×M cells 160, the structure 150 can output M accumulated voltage differences representing M values, in parallel. The electrical energy transferred from a $j^{th}$ column of cells 160 to the $j^{th}$ BLT or the $j^{th}$ BLC wire can be differentially amplified and latched by a $j^{th}$ sense amplifier in the circuit 152, which causes the electrical energy accumulated from the $j^{th}$ column of cells 160 to be outputted.

Figure 4:
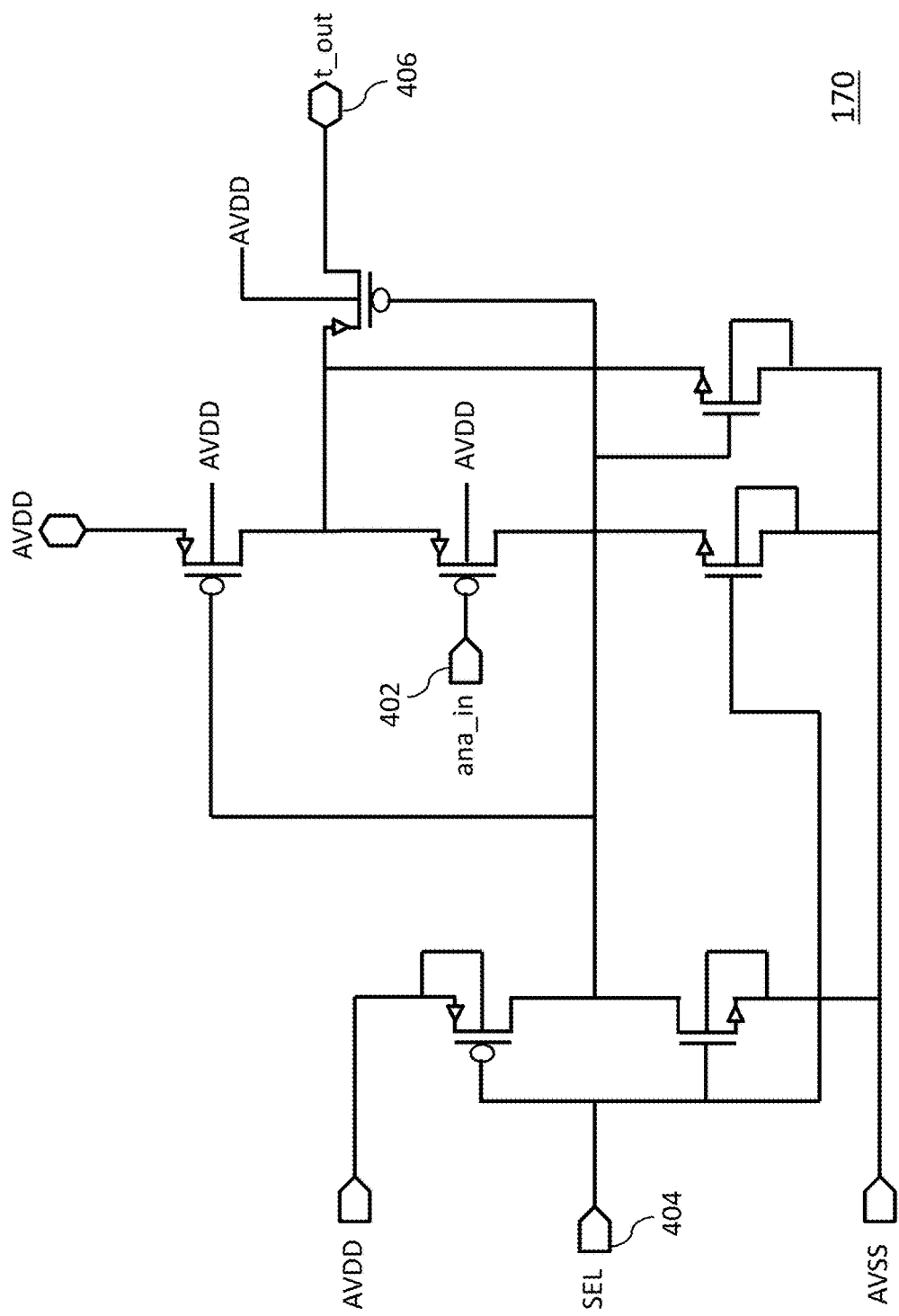
FIG. 4 is a diagram showing details of a circuit that can be implemented with a capacitive processing unit in one embodiment.

FIG. 4 is a diagram showing details of a circuit that can be implemented with a capacitive processing unit in one embodiment. FIG. 4 may include components that are labeled identically to components of FIGS. 1-3, which will not be described again for the purposes of clarity. The description of FIG. 4 may reference at least some of the components of FIGS. 1-3.

FIG. 4 shows details of the circuit 170 in one embodiment. The analog_in (ana_in) pin 402 can be connected to the BLT wire of a corresponding column. For example, the pin 402 of the circuit 170_1 at column M=1 can be connected to the BLT wire of column M=1. The circuit 170 can receive selection signal at pin 404, where the selection signal can activate or deactivate the circuit 170. For example, when the SEL pin receives a logic '1' signal, the input impedance is high and the output impedance is low, causing the circuit 170 to operate as an analog buffer and allowing current to flow through the circuit 170. When the SEL pin receives a logic '0' signal, the circuit 170 is turned off, both the input impedance and output impedance are high, and no current will flow through the circuit 170. A $j^{th}$ circuit 170 can collect the electrical energy outputted from the $j^{th}$ column of cells 160, and during a read out operation, the $j^{th}$ circuit 170 can output the stored electrical energy accumulated from the $j^{th}$ column of cells 160 via the t_out pin 406. The t_out pin 406 can be connected to a read out pin of the structure 150, and energy accumulated from columns of cells 160 can be outputted to one or more devices external to the structure 150 via this read out pin.

Figure 5:
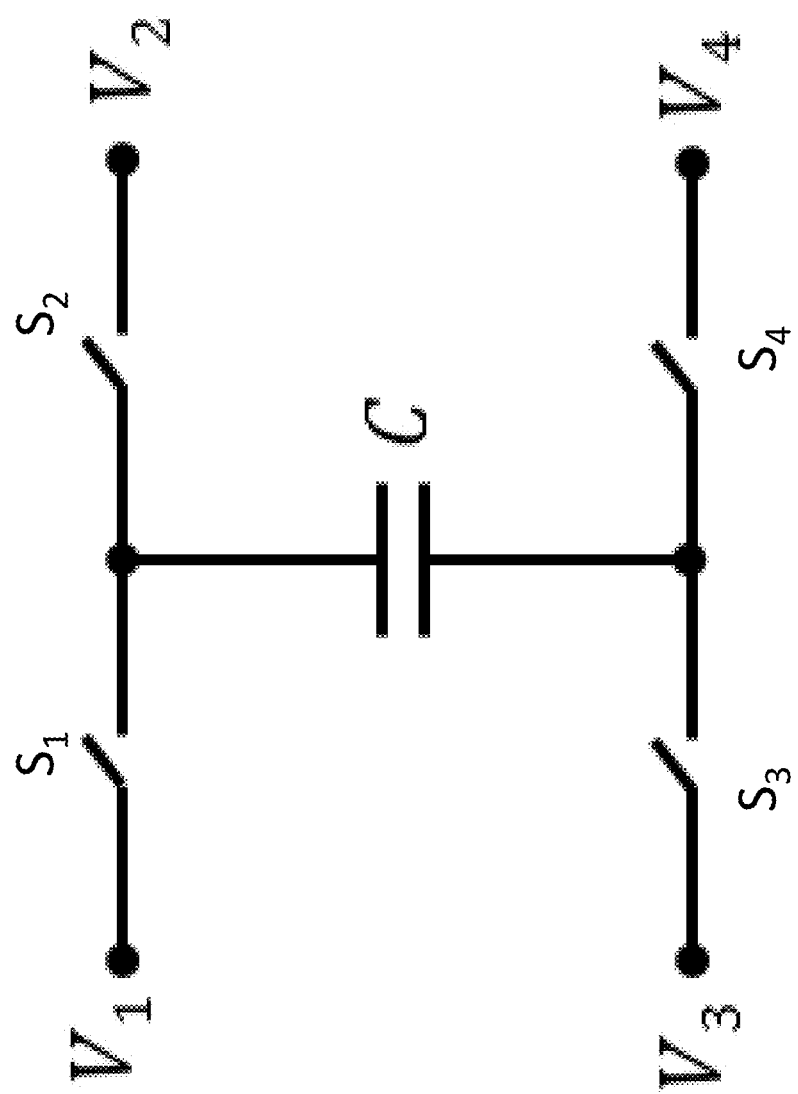
FIG. 5 is a diagram showing an example implementation of a capacitive processing unit in one embodiment.

FIG. 5 is a diagram showing an example implementation of a capacitive processing unit in one embodiment. FIG. 5 may include components that are labeled identically to components of FIGS. 1-4, which will not be described again for the purposes of clarity. The description of FIG. 5 may reference at least some of the components of FIGS. 1-4.

An example diagram in FIG. 5 can be used to represent some electrical characteristics of the cells 160. Comparing the diagram in FIG. 5 to FIG. 3, the switch $S_1$ can represent the PMOS 312, the switch $S_3$ can represent the PMOS 310, the switch $S_2$ can represent the NMOS 316, and the switch $S_4$ can represent the NMOS 314. The NMOS transistors 310, 312 and the PMOS transistors 314, 316 can be implemented as switches $S_1, S_2, S_3, S_4$ (e.g., they can be turned ON or turned OFF by clock signals being applied to their respective gate terminals). The voltages $V_1$ and $V_3$ can represent the BIAS_T voltage and the voltages $V_2$ and $V_4$ can represent the BIAS_B voltage. The capacitor C can represent the capacitance corresponding to the voltage difference 330 between the BLT and BLC wires. In an example, since switches $S_1$ and $S_3$ are the same (e.g., both being NMOS), and switches $S_2$ and $S_4$ are the same (e.g., both being PMOS), the capacitance C can be based on a first difference of $V_1$-$V_3$ and a second difference of $V_2$-$V_4$, causing the cell 160 to operate analogously to a differential in, differential out amplifier.

In another example, if the switches $S_1$ and $S_4$ represent a first type of MOS, and the switches $S_2$ and $S_3$ represent a second type of MOS, an equivalent resistor can be formed between the voltage differences ($V_1$-$V_4$) and ($V_2$-$V_3$). $S_1$-$S_4$ can be also made from the same type of transistors, and for the correct functionality, both $S_1$ and $S_4$ can be ON at a first phase, and both $S_2$ and $S_3$ can be ON at a second phase, while the first and second phases are non-overlapping. Alternately, $S_1$ and $S_2$ can be opposite polarities of transistors operating on the same phase to ensure $S_1$ and $S_4$ are simultaneously ON and $S_2$ and $S_3$ are simultaneously ON, and $S_1$ and $S_2$ can be complementary in nature. In another example, if the switches $S_1$ and $S_4$ represent a first type of MOS, the switches $S_2$ and $S_3$ represent a second type of MOS, the voltage $V_1$=$V_3$, and the voltage $V_2$=$V_4$, then a resistor having a value of T/C can be formed between $V_1$ (or $V_3$) and $V_2$ (or $V_4$), where T denotes the period of the clock signal being applied on the gate terminals of the transistors being implemented as switches $S_1, S_2, S_3, S_4$.

FIG. 6 is a table showing an example implementation of a capacitive processing unit in one embodiment. FIG. 6 may include components that are labeled identically to components of FIGS. 1-5, which will not be described again for the purposes of clarity. The description of FIG. 6 may reference at least some of the components of FIGS. 1-5.

In an example, table 600 shows an example implementation of the cells 160 described herein. In table 600, the rows T1, T2, T3 are three operations in which the WEIGHT signals "00" are written to a first cell (CELL_0) and a second cell (CELL_1), and the written weights are read out as a voltage amount. At T1, the WWL wire (WWL_0) of CELL_0 receives a logic '1' and the WWL wire (WWL_1) of CELL_1 does not receive a logic '1', which facilitate a write operation to CELL_0 but not to CELL_1. Note that at T1, RWL_0='1' and RWL_1='0', which will not result in a read operation as all RWL wires need to be logic '1' to perform a read operation. Therefore, at T1, '0' will be written to CELL0 (the MOS elements of CELL_0 will not be charged). At T2, the WWL wire (WWL_1) of CELL_1 receives a logic '1', facilitating a write operation to CELL_1. Note that at T2, RWL_0='0' and RWL_1='1', which will not result in a read operation as all RWL wires need to be logic '1' to perform a read operation. Therefore, at T2, '0' will be written to CELL_1. At T3, both RWL_0 and RWL_1 are logic '1', and the electrical energy stored in the cells CELL_0 and CELL_1 are read out as voltages (0.38 mV), which in this case represents a logic '0'.

The rows T4, T5, T6 are three operations in which the WEIGHT signals "01" are written to a first cell (CELL_0) and a second cell (CELL_1), and the written weights are read out as a voltage amount. At T4, the WWL wire (WWL_0) of CELL_0 receives a logic '1' and the WWL wire (WWL_1) of CELL_1 does not receive a logic '1', which facilitate a write operation to CELL_0 but not to CELL_1. Note that at T4, RWL_0='1' and RWL_1='0', which will not result in a read operation as all RWL wires need to be logic '1' to perform a read operation. Therefore, at T4, '0' will be written to CELL_0. At T5, the WWL wire (WWL_1) of CELL_1 receives a logic '1', facilitating a write operation to CELL_1. Note that at T5, RWL_0='0' and RWL_1='1', which will not result in a read operation as all RWL wires need to be logic '1' to perform a read operation. Therefore, at T5, '1' will be written to CELL_1. At T6, both RWL_0 and RWL_1 are logic '1', and the electrical energy stored in the cells CELL_0 and CELL_1 are read out as voltages (0.550 mV), which in this case represents a logic '1'. Note that comparing T3 to T6, T6 outputs a higher voltage because CELL_1 was previously storing a'0' at T2 and subsequently updated to store a '1' (or was charged) at T5.

The rows T7, T8, T9 are three operations in which the WEIGHT signals "11" are written to a first cell (CELL0) and a second cell (CELL_1), and the written weights are read out as a voltage amount. At T7, the WWL wire (WWL_0) of CELL_0 receives a logic '1' and the WWL wire (WWL_1) of CELL_1 does not receive a logic '1', which facilitate a write operation to CELL_0 but not to CELL_1. Note that at T7, RWL_0='1' and RWL_1='0', which will not result in a read operation as all RWL wires need to be logic '1' to perform a read operation. Therefore, at T7, '1' will be written to CELL_0. At T8, the WWL wire (WWL_1) of CELL_1 receives a logic '1', facilitating a write operation to CELL_1. Note that at T8, RWL_0='0' and RWL_1='1', which will not result in a read operation as all RWL wires need to be logic '1' to perform a read operation. Therefore, at T8, '1' will be written to CELL_1. At T9, both RWL_0 and RWL_1 are logic '1', and the electrical energy stored in the cells CELL_0 and CELL_1 are read out as voltages (0.799 mV), which in this case represents a logic '1'. Note that comparing T6 to T9, T9 outputs a higher voltage because CELL_0 was previously storing a 'O' at T5 and subsequently updated to store a '1' (or was charged) at T8.

Figure 7:
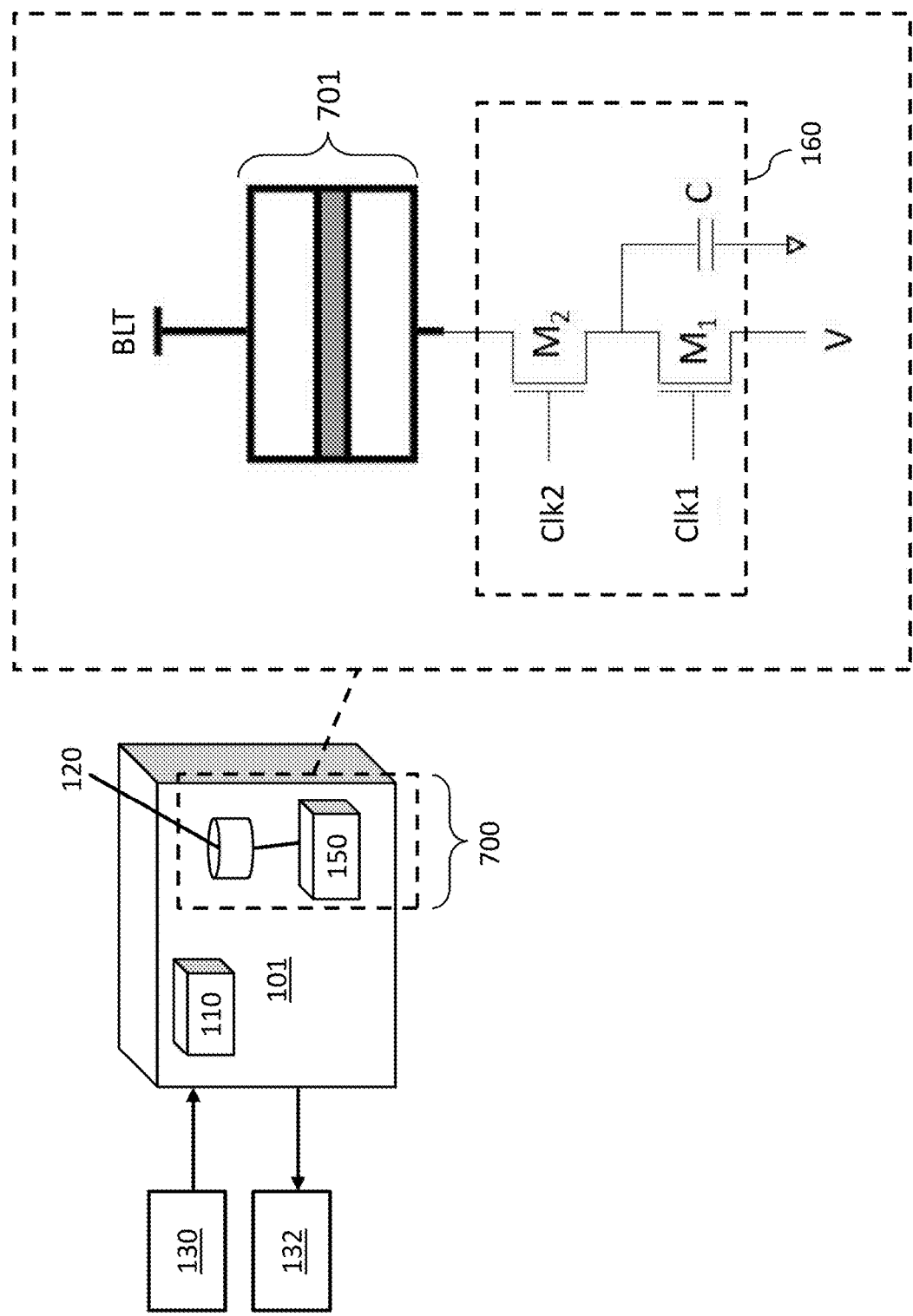
FIG. 7 is a diagram showing an example memory device with an integrated capacitive processing unit in one embodiment.

FIG. 7 is a diagram showing an example memory device with an integrated capacitive processing unit in one embodiment. FIG. 7 may include components that are labeled identically to components of FIGS. 1-6, which will not be described again for the purposes of clarity. The description of FIG. 7 may reference at least some of the components of FIGS. 1-6.

The structure 150 coupled with the memory 120 can be packaged as a memory device 700 configured to perform in-memory processing. In an example shown in FIG. 7, the memory 120 can be a non-volatile memory (NVM) such as magnetoresistive random-access memory (MRAM), or other types of non-volatile memory (such as ReRAM, RRAM, FLASH, etc.).

Based on the structure 150 being coupled to the NVM 120, as the capacitive elements in cells 160 are being charged or discharged, the weights that may be stored in the memory 120 can also be updated accordingly. By coupling the structure 150 to a non-volatile memory (e.g., memory 120), update to the weights stored in the non-volatile memory can be performed locally in the cells 160 without a need of having additional components to facilitate transmission of data between the structure 150 and the memory 120. In some example embodiments, the cells 160 can be implemented as volatile memory cells. The memory device 700 can be implemented as a memory device that provides both volatile and non-volatile storage, where updates being performed to the volatile storage elements can be directly forwarded to the non-volatile storage elements.

In the example shown in FIG. 7, the capacitance C can represent one or more of the capacitive elements (e.g., PMOS 310, 312 and/or NMOS 314, 316) among the cell 160. In some examples, the capacitance C can be a capacitance of a capacitive element such as a transistor based capacitor, a trench based capacitor, a dielectric based capacitor, a wire capacitor such as metal insulator metal (MIM), and/or other forms of capacitor. In some examples, the type of capacitor to be implemented in the cell 160 can be based on a desired implementation of the system 100. The transistor $M_1$ can represent the NMOS 304, the transistor $M_2$ can represent the NMOS 302, the clock signal $Clk_1$ can represent the RWL signal, and the clock signal $Clk_2$ can represent the WWL signal. When $Clk_1$ is high (logic '1') and $Clk_2$ is low (logic '0'), the transistor $M_1$ can be activated and the transistor $M_2$ will not be activated, and the MRAM 701 is not updated. Further, the transistor $M_1$ being activated with the transistor $M_2$ being deactivated can facilitate a read operation to read out the stored energy from the cell 160 as a voltage V. When $Clk_1$ is low and $Clk_2$ is high, the transistor $M_1$ can be deactivated and the transistor $M_2$ can be activated, and the MRAM bit 701 can be updated according to the capacitance C. Note that in an example embodiment, the MRAM bit 701 (or other non-volatile memory bit) can be situated or connected between a BLT wire and a corresponding cell 160. For example, referencing the example in FIG. 3, the MRAM bit 701 can be connected between the BLT wire and the transistor 302.

Figure 8:
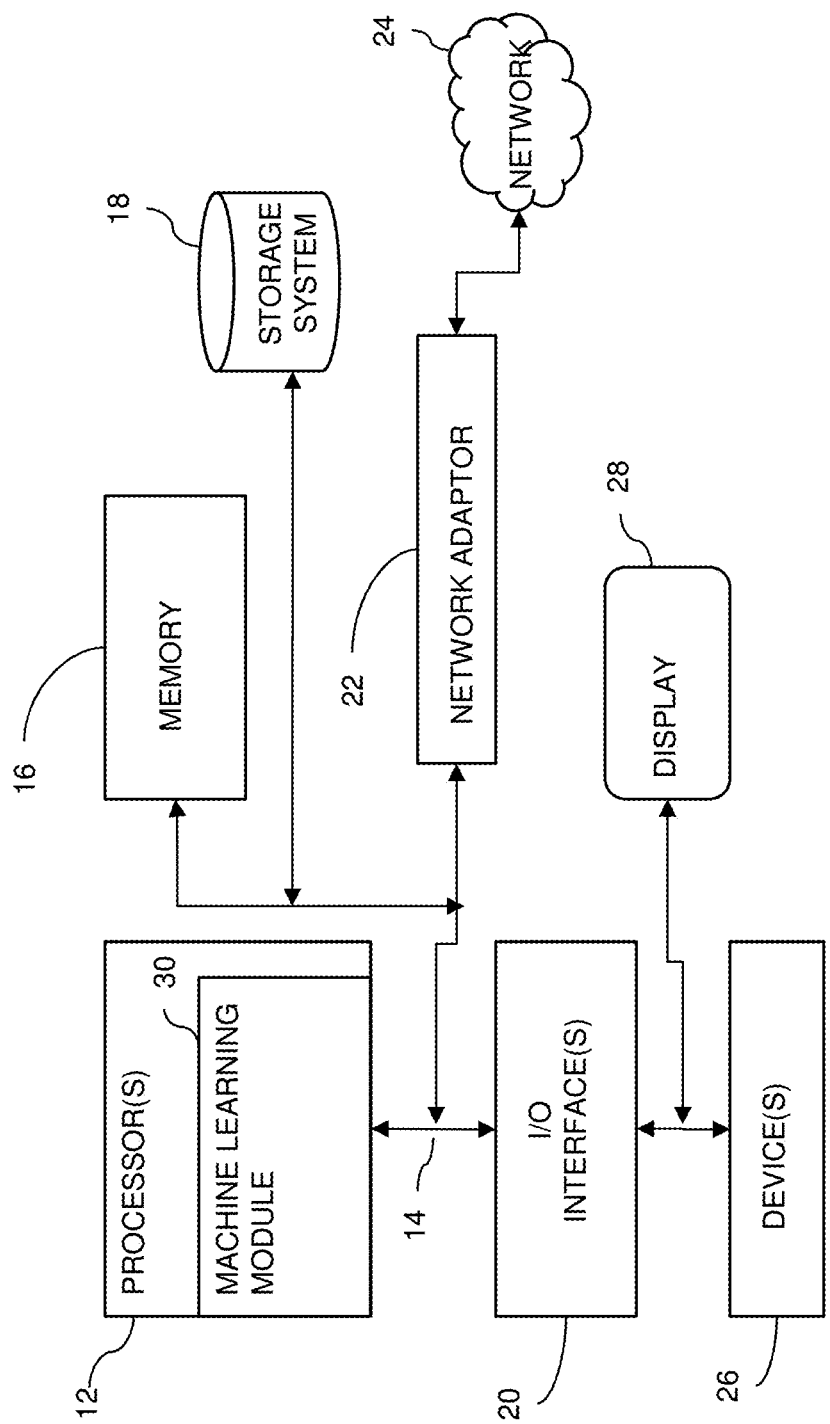
FIG. 8 illustrates a schematic of an example computer or processing system that can implement a capacitive processing unit in one embodiment of the present disclosure.

FIG. 8 illustrates a schematic of an example computer or processing system that can implement a capacitive processing unit in one embodiment of the present disclosure. The computer system is only one example of a suitable processing system and is not intended to suggest any limitation as to the scope of use or functionality of embodiments of the methodology described herein. The processing system shown can be operational with numerous other general purpose or special purpose computing system environments or configurations. Examples of well-known computing systems, environments, and/or configurations that can be suitable for use with the processing system shown in FIG. 8 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, supercomputers, and distributed cloud computing environments that include any of the above systems or devices, and the like.

The computer system can be described in the general context of computer system executable instructions, such as program modules, being executed by a computer system. Generally, program modules may include routines, programs, objects, components, logic, data structures, and so on that perform particular tasks or implement particular abstract data types. The computer system can be practiced in distributed cloud computing environments where tasks are performed by remote processing devices that are linked through a communications network. In a distributed cloud computing environment, program modules can be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 30 (e.g., machine learning module 30) that performs the methods described herein. The module 30 can be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media can be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces. In some examples, the system memory 16 can include a structure including one or more capacitive processing units as described herein.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention can be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A structure comprising:
an array of memory cells, a memory cell comprises a plurality of metal-oxide-semiconductor (MOS) elements, the plurality of MOS elements comprising:
a first MOS element, wherein a source terminal of the first MOS element is connected to a drain terminal of the first MOS element, and the source terminal and the drain terminal of the first MOS element is connected to a first bias;
a second MOS element, wherein a source terminal of the second MOS element is connected to a drain terminal of the second MOS element, and the source terminal and the drain terminal of the second MOS element is connected to the first bias;
a third MOS element, wherein a source terminal of the third MOS element is connected to a drain terminal of the third MOS element, and the source terminal and the drain terminal of the third MOS element is connected to a second bias;
a fourth MOS element, wherein a source terminal of the fourth MOS element is connected to a drain terminal of the fourth MOS element, and the source terminal and the drain terminal of the fourth MOS element is connected to the second bias;
wherein the connections between the source terminals and the drain terminals of the first MOS element, the second MOS element, the third MOS element, and the fourth MOS element causes the plurality of MOS elements to exhibit capacitive behavior for storing electrical energy;
a first transistor connected to the plurality of MOS elements, wherein activation of the first transistor facilitates a write operation to the memory cell;
a second transistor connected to the plurality of MOS elements, wherein activation of the second transistor facilitates a read operation from the memory cell; and
a plurality of analog circuits configured to accumulate and store electrical energy outputted from a corresponding column of memory cells among the array of memory cells, each analog circuit among the plurality of analog circuits comprises an input transistor driven by the electrical energy outputted from the corresponding column of memory cells, wherein the input transistor is connected in series with a p-channel metal-oxide-semiconductor (PMOS) switch and a n-channel metal-oxide-semiconductor (NMOS) switch, and a gate of the PMOS switch and a gate of the NMOS switch are driven by a pair of complementary signals.

2. The structure of claim 1, wherein the electrical energy being stored in a column of the memory cells is accumulated to represent a weight in an artificial neural network.

3. The structure of claim 1, wherein the first MOS element is a first p-channel metal-oxide-semiconductor (PMOS) transistor, the second MOS element is a second PMOS transistor, the third MOS element is a first n-channel metal-oxide-semiconductor (NMOS), and the fourth MOS element a second NMOS transistor.

4. The structure of claim 3, wherein the first PMOS transistor and the second PMOS transistor are connected in parallel, the first NMOS transistor and the second NMOS transistor are connected in parallel.

5. The structure of claim 1, wherein:
the first transistor is a first NMOS transistor;
the second transistor is a second NMOS transistor;
a drain terminal of the first NMOS transistor is connected to a bit line true (BLT) wire;
a source terminal of the first NMOS transistor is connected to the plurality of MOS elements;
a drain terminal of the second NMOS transistor is connected to the plurality of MOS elements; and
a source terminal of the second NMOS transistor is connected to a bit line complimentary (BLC) wire.

6. The structure of claim 5, wherein:
a gate of the first NMOS transistor is controlled by a first clock signal;
a gate of the second NMOS transistor is controlled by a second clock signal;
in response to the first clock signal activating the first NMOS transistor, an input from the BLT wire is transmitted to the plurality of MOS elements; and in response to the second clock signal activating the second NMOS, a voltage difference between the BLT wire and the BLC wire is outputted.

7. The structure of claim 1, further comprising at least one circuit configured to bias the capacitance of the plurality of MOS elements.

8. The structure of claim 1, wherein the array of memory cells is integrated with a non-volatile memory.

9. A system comprising:
a memory;
a processor configured to be in communication with the memory;
a structure configured to be in communication with the memory and the processor, the structure comprises:
  an array of memory cells, a memory cell comprises a plurality of metal-oxide-semiconductor (MOS) elements, the plurality of MOS elements comprises:
    a first MOS element, wherein a source terminal of the first MOS element is connected to a drain terminal of the first MOS element, and the source terminal and the drain terminal of the first MOS element is connected to a first bias;
    a second MOS element, wherein a source terminal of the second MOS element is connected to a drain terminal of the second MOS element, and the source terminal and the drain terminal of the second MOS element is connected to the first bias;
    a third MOS element, wherein a source terminal of the third MOS element is connected to a drain terminal of the third MOS element, and the source terminal and the drain terminal of the third MOS element is connected to a second bias;
    a fourth MOS element, wherein a source terminal of the fourth MOS element is connected to a drain terminal of the fourth MOS element, and the source terminal and the drain terminal of the fourth MOS element is connected to the second bias;
    wherein the connections between the source terminals and the drain terminals of the first MOS element, the second MOS element, the third MOS element, and the fourth MOS element causes the plurality of MOS elements to exhibit capacitive behavior for storing electrical energy;
    a first transistor connected to the plurality of MOS elements, wherein activation of the first transistor facilitates a write operation to the memory cell;
    a second transistor connected to the plurality of MOS elements, wherein activation of the second transistor facilitates a read operation from the memory cell;
  a plurality of analog circuits configured to accumulate and store electrical energy outputted from a corresponding column of memory cells among the array of memory cells, each analog circuit among the plurality of analog circuits comprises an input transistor driven by the electrical energy outputted from the corresponding column of memory cells, wherein the input transistor is connected in series with a PMOS switch and a NMOS switch, and a gate of the PMOS switch and a gate of the NMOS switch are driven by a pair of complementary signals; and
the processor being configured to generate one or more control signals to control the write and read operations of the array of memory cells.

10. The system of claim 9, wherein the electrical energy being stored in a column of the memory cells is accumulated to represent a weight in an artificial neural network.

11. The system of claim 9, wherein the first MOS element is a first p-channel metal-oxide-semiconductor (PMOS) transistor, the second MOS element is a second PMOS transistor, the third MOS element is a first n-channel metal-oxide-semiconductor (NMOS), and the fourth MOS element a second NMOS transistor.

12. The system of claim 11, wherein the first PMOS transistor and the second PMOS transistor are connected in parallel, the first NMOS transistor and the second NMOS transistor are connected in parallel.

13. The system of claim 9, wherein:
the first transistor is a first NMOS transistor;
the second transistor is a second NMOS transistor;
a drain terminal of the first NMOS transistor is connected to a bit line true (BLT) wire;
a source terminal of the first NMOS transistor is connected to the plurality of MOS elements;
a drain terminal of the second NMOS transistor is connected to the plurality of MOS elements; and
a source terminal of the second NMOS transistor is connected to a bit line complimentary (BLC) wire.

14. The system of claim 9, wherein:
a gate of the first NMOS transistor is controlled by a first clock signal;
a gate of the second NMOS transistor is controlled by a second clock signal;
in response to the first clock signal activating the first NMOS transistor, an input from the BLT wire is transmitted to the plurality of MOS elements; and
in response to the second clock signal activating the second NMOS, a voltage difference between the BLT wire and the BLC wire is outputted.

15. The system of claim 9, wherein the structure further comprises at least one circuit configured to bias the capacitance of the plurality of MOS elements.

16. The system of claim 9, wherein the memory is a non-volatile memory, and the structure is integrated with the memory.

17. A memory device comprising:
a non-volatile memory configured to store data;
a structure coupled to the non-volatile memory, the structure comprises an array of memory cells, a memory cell comprises a plurality of metal-oxide-semiconductor (MOS) elements, the plurality of MOS elements comprising:
  a first MOS element, wherein a source terminal of the first MOS element is connected to a drain terminal of the first MOS element, and the source terminal and the drain terminal of the first MOS element is connected to a first bias;
  a second MOS element, wherein a source terminal of the second MOS element is connected to a drain terminal of the second MOS element, and the source terminal and the drain terminal of the second MOS element is connected to the first bias;
  a third MOS element, wherein a source terminal of the third MOS element is connected to a drain terminal of the third MOS element, and the source terminal and the drain terminal of the third MOS element is connected to a second bias;
  a fourth MOS element, wherein a source terminal of the fourth MOS element is connected to a drain terminal of the fourth MOS element, and the source terminal and the drain terminal of the fourth MOS element is connected to the second bias;
wherein the connections between the source terminals and the drain terminals of the first MOS element, the second MOS element, the third MOS element, and the fourth MOS element causes the plurality of MOS elements to exhibit capacitive behavior for storing electrical energy;
a first transistor connected to the plurality of MOS elements, wherein activation of the first transistor facilitates a write operation to the memory cell;
a second transistor connected to the plurality of MOS elements, wherein activation of the second transistor facilitates a read operation from the memory cell; and
wherein the write operation changes the capacitance of the plurality of MOS elements, and the changed capacitance updates the data stored in the non-volatile memory; and
a plurality of analog circuits configured to accumulate and store electrical energy outputted from a corresponding column of memory cells among the array of memory cells, each analog circuit among the plurality of analog circuits comprises an input transistor driven by the electrical energy outputted from the corresponding column of memory cells, wherein the input transistor is connected in series with a PMOS switch and a NMOS switch, and a gate of the PMOS switch and a gate of the NMOS switch are driven by a pair of complementary signals.

18. The memory device of claim 17, wherein the read operation facilitates a read out of the data stored in the non-volatile memory as a voltage.

* * * * *